United States Patent
Hung et al.

(10) Patent No.: US 9,257,992 B2
(45) Date of Patent: Feb. 9, 2016

(54) COMMUNICATION DEVICE AND CONTROL METHOD THEREOF

(71) Applicant: MStar Semiconductor, Inc., Hsinchu Hsien (TW)

(72) Inventors: Chih-Ming Hung, Zhubei (TW);
Yueh-Ting Lee, Zhubei (TW);
Cheng-Chieh Lin, Zhubei (TW);
Yao-Chi Wang, Zhubei (TW);
Shih-Chieh Yen, Zhubei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 14/300,377

(22) Filed: Jun. 10, 2014

(65) Prior Publication Data

US 2014/0361846 A1    Dec. 11, 2014

Related U.S. Application Data

(60) Provisional application No. 61/832,967, filed on Jun. 10, 2013.

(51) Int. Cl.
*H03L 1/00* (2006.01)
*H03B 5/36* (2006.01)

(52) U.S. Cl.
CPC .. *H03L 1/00* (2013.01); *H03B 5/36* (2013.01); *H03B 2201/0208* (2013.01)

(58) Field of Classification Search
CPC ............................................. H03L 1/00
USPC ..................... 331/36 C, 158, 177 V
See application file for complete search history.

(56) References Cited

U.S. PATENT DOCUMENTS

| | | | |
|---|---|---|---|
| 6,954,113 B2 * | 10/2005 | Fallisgaard et al. | 331/158 |
| 7,221,233 B2 | 5/2007 | Brennan et al. | |
| 7,714,665 B2 * | 5/2010 | Waheed et al. | 331/16 |
| 2014/0253256 A1 * | 9/2014 | McCorquodale et al. | 331/36 C |

OTHER PUBLICATIONS

TIPO Office Action, Dec. 7, 2015, 5 pages.

* cited by examiner

*Primary Examiner* — Joseph Chang
(74) *Attorney, Agent, or Firm* — Edell, Shapiro & Finnan, LLC

(57) ABSTRACT

A communication device is provided in the present invention. The communication device comprises an oscillation signal source, a tunable capacitor array, a frame counter; and a control module. The control module is configured to jointly or separately control the tunable capacitor array and the frame counter to compensate a first frequency offset of the oscillation signal source when the communication device operates in a first mode, and to jointly or separately control the tunable capacitor array and the frame counter to compensate a second frequency offset of the oscillation signal source when the communication device operates in a second mode.

18 Claims, 5 Drawing Sheets

COMMUNICATION DEVICE AND CONTROL METHOD THEREOF

This application claims the benefit of U.S. provisional application Ser. No. 61/832,967, filed Jun. 10, 2013, the subject matter of which is incorporated herein by reference.

BACKGROUND OF THE INVENTION

1. Field of the Invention

The invention relates in general to a frequency offset correction technique for an oscillation signal source, and more particularly to a technique for correcting a frequency offset of an oscillation signal source caused by a loading amount.

2. Description of the Related Art

Most electronic systems are equipped with at least one oscillation signal source (e.g., a crystal oscillator) that provides clock signals as references for circuit operations. How to maintain a stable output frequency of an oscillation signal under all circumstances is an important issue. For example, a frequency drift may arise in output signals of an oscillation signal source when an ambient temperature changes. To prevent functions of an electronic system from being affected by environmental factors, a frequency offset compensating mechanism is essential in electronic systems.

Accompanied by advancements in electronic-related technologies, wireless communication apparatuses in all diversities are becoming increasingly popular. Circuits in current wireless communication apparatuses generally need two types of reference clock signals—system clock signals and real-time clock signals. System clock signals have a higher frequency (usually in MHz range), and are fundamental signals that many circuits refer to for operations. Real-time clock signals have a lower frequency (usually in kHz range), and mainly serve for assisting a wireless communication apparatus to count a real time (e.g., current hour, minute and second) to facilitate the wireless communication apparatus to synchronize and/or communicate with other wireless systems such as base stations. In a conventional hardware configuration, two sets of oscillation signal sources, having different oscillation frequencies and respectively outputting system clock signals and real-time signals, are arranged in the same wireless communication apparatus.

To reduce hardware costs, in another conventional approach, system clock signals and real-time clock signals are designed to share the same oscillation signal source. FIG. 1 is an example showing a partial schematic diagram of such type of electronic system. In the example, system clock signals have a frequency of 26 MHz, and real-time clock signals have a frequency of 32 kHz. The output frequency of an oscillation signal source 12 is 26 MHz and the output signal is provided to a buffer amplifier 14 and a frequency divider 16. The buffer amplifier 14 provides the amplified 26 MHz signals to its subsequent circuits (e.g., a baseband circuit) to serve as system clock signals. The frequency divider 16 divides the 26 MHz signal to generate signals having a 32 kHz frequency. A frame counter 17, coupled to one of the outputs of the frequency divider 16, counts the number of 32 kHz pulses from the frequency divider 16, and changes its output signal when the counting result reaches a predetermined threshold. The frame counter 17, which may be regarded as another frequency divider, outputs signals to control the system events.

In practice, the electronic system in FIG. 1 may be a mobile phone. In order to have proper operations, the mobile phone has to be synchronized to a base station which provides communication services. The synchronization is accomplished by decoding and tracking the difference between local clocks and the clocks in the base station. In the event that the clock signals of the mobile phone become inaccurate (e.g., when a frequency offset arises due to an ambient temperature change), settings of a coarse-tuning capacitor array 18A and/or a fine-tuning capacitor array 18B may be adjusted (i.e., equivalent to changing a loading amount of the oscillation signal source 12) to correct the output frequency of the oscillation signal source 12.

It is well-known to those skilled in the art that a mobile phone enters from a normal operation mode to a low power consumption standby mode at a predetermined interval. To lower the overall power dissipation, in the low power consumption mode, the buffer amplifier 14 and its subsequent circuits that utilize the system clock signals are turned off. The tuning capacitor arrays are set to their low capacitance state. It is apparent that the corresponding loading amounts that the oscillation signal source 12 needs to drive are different between the normal operation mode and the low power consumption mode. The change in the loading amount also causes a frequency offset in output signals of the oscillation signal source 12, leading the frequency of the real-time clock signals to deviate from 32 kHz in the low power consumption mode. However, as the mobile phone in the low power consumption mode does not synchronize with the base station, reference information for correcting the frequency offset cannot be acquired. Thus, when the frequency offset becomes too excessive, the "real time" that is determined based on the real-time clock signals may significantly deviate from the desired value causing the mobile phone to return to the normal operation mode either too early or too late potentially failing the communication with a base station.

SUMMARY OF THE INVENTION

The invention is directed to a communication device and frequency offset compensating method thereof for overcoming the above issues.

According to an embodiment of the present invention, a communication device is provided. The communication device comprises an oscillation signal source, a tunable capacitor array, a frame counter; and a control module. The control module is configured to jointly or separately control the tunable capacitor array and the frame counter to compensate a first frequency offset of the oscillation signal source when the communication device operates in a first mode, and to jointly or separately control the tunable capacitor array and the frame counter to compensate a second frequency offset of the oscillation signal source when the communication device operates in a second mode.

According to another embodiment of the present invention, a control method applied to a communication device is provided. The communication device comprises an oscillation signal source, a tunable capacitor array and a frame counter. The control method comprises when the communication device operates in a first mode, compensating a first frequency offset of the oscillation signal source jointly or separately by the tunable capacitor array and the frame counter; and when the communication device operates in a second mode, compensating a second frequency offset of the oscillation signal source jointly or separately by the capacitor array and the frame counter.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
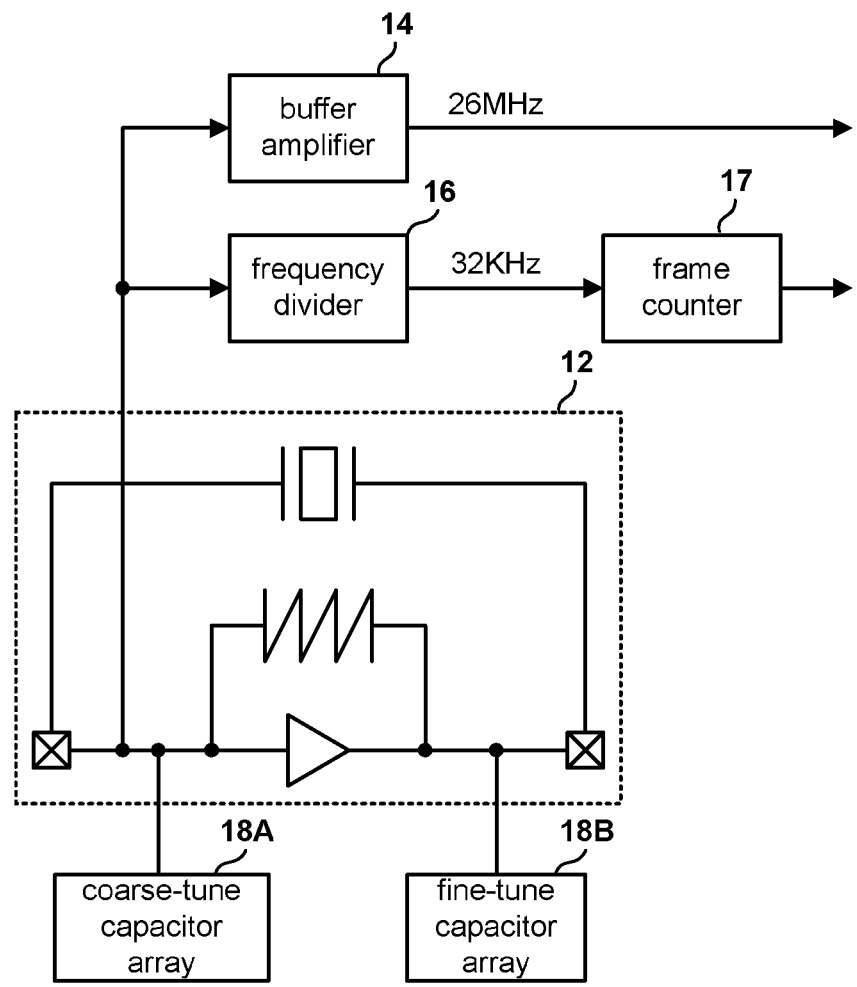
FIG. 1 is an example showing a partial schematic diagram of an electronic system in which system clock signals and real-time clock signals share a same oscillation signal source.
Figure 2:
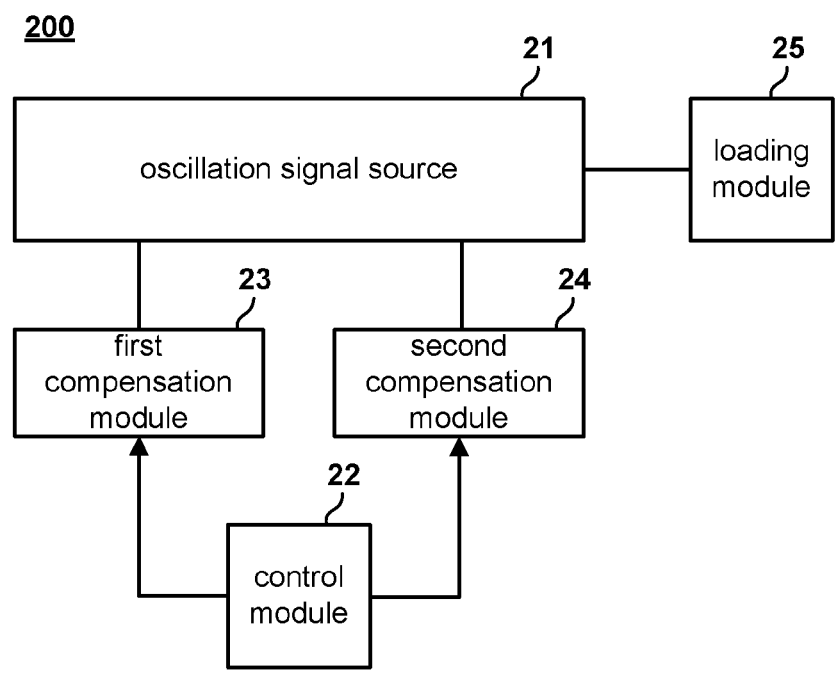
FIG. 2 is a function block diagram of an electronic system according to an embodiment of the present invention.

FIG. 2 shows a functional block diagram of an electronic system according to an embodiment of the present invention. It should be noted that, the term "present invention" refers to invention concepts described by embodiments below. However, the disclosed embodiments are not to be construed as limitations to the scope of the invention concepts. In practice, for example, an electronic system 200 in FIG. 2 may be a mobile communication device.

As shown in FIG. 2, the electronic system 200 includes an oscillation signal source 21, a control module 22, a first compensation module 23, a second compensation module 24, and a loading module 25. In practice, the loading module 25 may include one or multiple circuits that require oscillation signals provided by the oscillation signal source 21 or can affect the loading amount of the oscillation signal source 21. When the loading module 25 forms a first loading amount on the oscillation signal source 21, the control module 22 jointly or separately controls the first compensation module 25 and the second compensation module 24 to compensate a first frequency offset of the oscillation signal source 21 caused by at least one environmental factor (e.g., a change in the temperature and/or in a supply voltage). When the loading module 25 changes from forming the first loading amount to forming a second loading amount on the oscillation signal source 21, the control module 22 jointly or separately controls the first compensation module 25 and the second compensation module 24 to compensate a second frequency offset of the oscillation signal source 21 caused by a load difference. The load difference is a change between the first loading amount and the second loading amount. Operation details of the first compensation module 23 and the second compensation module 24 are to be described shortly.

In practice, a change in the loading amount may occur when the electronic system 200 changes its operation mode. For example, when the electronic system 200 is switched from a normal operation mode to a low power consumption mode, a part of the circuits in the loading module 25 and/or in the first compensation module 23 and/or in the second compensation module 24 may be partially disabled in a way that the total loading amount seen by the oscillation signal source 21 is altered. Through simulations and experiments, the Applicant discovers that the frequency offset of the oscillation signal caused by the change in the loading amount is substantially a fixed value, and does not fluctuate along with the environmental factors such as the temperature. Therefore, the frequency offset caused by a change in the loading amount and the frequency offset caused by the environmental factors may be jointly or separately compensated by two different modules (the first compensation module 23 and the second compensation module 24).

In one embodiment, assume that a total load that the loading module 25 and the compensation modules 23 and 24 form on the oscillation signal source 21 when the electronic system 200 is in the normal operation mode is the foregoing first loading amount, and a total load that the loading module 25 and the compensation modules 23 and 24 form on the oscillation signal source 21 when the electronic system 200 is in the lower power consumption mode is the foregoing second loading amount. When the electronic system 200 is in the normal operation mode, the frequency offset caused by the environmental factors are dynamically compensated mainly by the first compensation module 23. In contrast, when the electronic system 200 is switched from the normal operation mode to the low power consumption mode, part of the first compensation module 23 and the second compensation module 24 jointly or separately compensates the frequency offset caused by the change in the loading amount. In practice, the total loading amount under different modes can be predicted, and the frequency offset caused by the change in the loading amount may be measured or calculated in advance before the electronic system 200 is shipped out of the factory. The information of the frequency offset may be recorded in the control module 22, or be recorded in a storage device accessible by the control module 22 in the electronic system 200 to accordingly control the first and the second compensation module 24 jointly or separately.

In one embodiment, the control module 22 supports an environmental factor detection function, and controls the first compensation module 23 according to the detection result. In such circumstances, even when the electronic system 200 is in the low power consumption mode, the first compensation module 23 may also compensate the frequency offset caused by the change in the environmental factors. In other words, the first compensation module 23 and the second compensation module 24 are capable of concurrent and independent operations.

When the electronic system 200 is a mobile communication device, the control module 22 may determine the magnitude of an influence that the environmental factors pose on the oscillation signal source 21 according to reference data (e.g., time information) provided by a base station, and accordingly control the first compensation module 23 and determine the amount of frequency compensation that the first compensation module 23 is to apply to the oscillation signal source 21.

Figure 3:
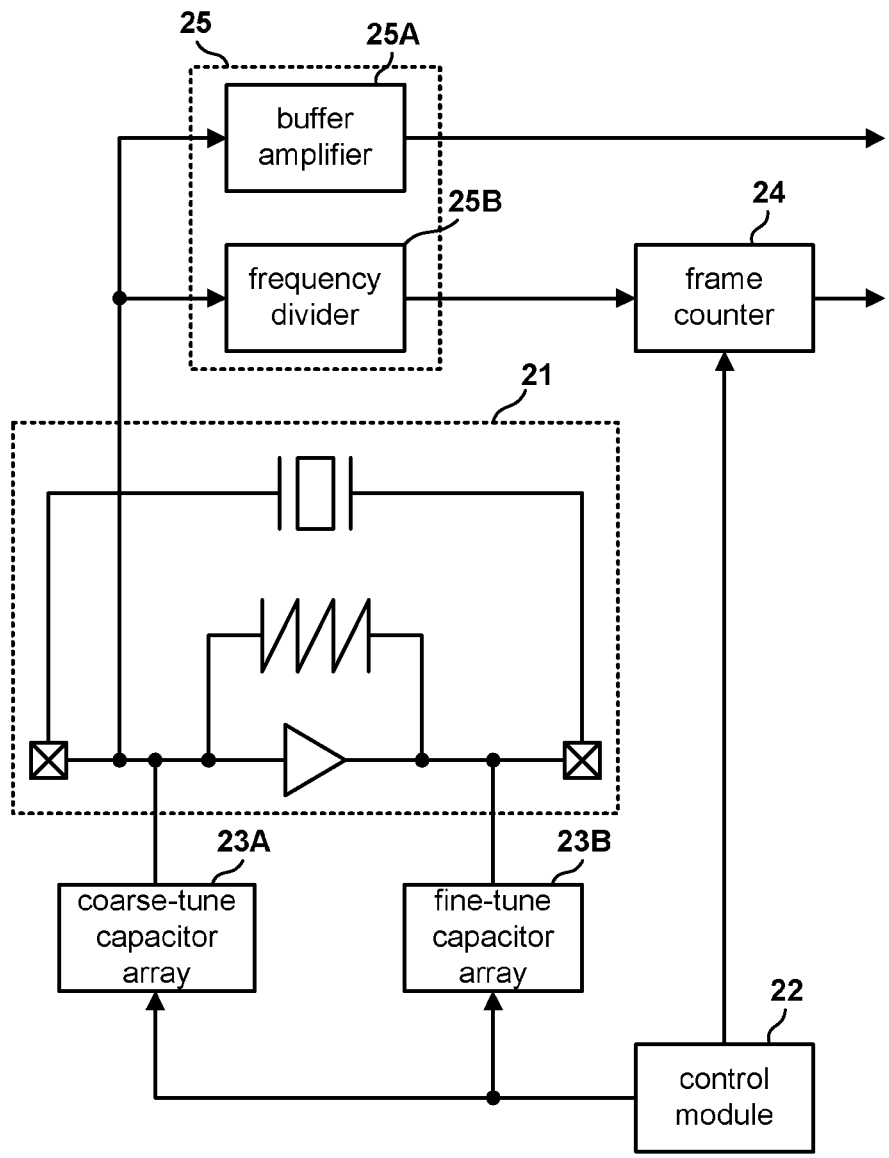
FIG. 3 is a detailed schematic diagram of compensation modules according to an embodiment of the present invention.

FIG. 3 shows a detailed schematic diagram of a first compensation module 23 and the second compensation module 24 according to an embodiment. As shown in FIG. 3, the first compensation module 23 may be a tunable capacitor array, and includes a coarse-tune capacitor array 23A and a fine-tune capacitor array 23B (to be jointly referred to as a capacitor array 23). The second compensation module 24 is a frame counter. The frame counter 24 counts the number of pulses in output signals from a frequency divider 25B, and changes its output signal when a counting result reaches a predetermined threshold. Further, the loading module 25 includes a buffer amplifier 25A and a frequency divider 25B. Output frequencies of the buffer amplifier 25A and the oscillation signal source 21 are the same, and an output frequency of the frequency divider 25B is lower than the output frequency of the oscillation signal source 21. When the electronic system 200 is in the normal operation mode, the buffer amplifier 25A and the frequency divider 25B are both maintained in an operating state. When the electronic system 200 is in the low power consumption mode, the buffer amplifier 25A is turned off and part of the capacitor array 23 may be set to their low capacitance state whereas the frequency divider 25B continues to operate.

A situation where the electronic system 200 is a mobile communication device is described in embodiments below. Assume that when the electronic system 200 is in the normal operation mode, the control module 22 controls the capacitor array 23 according to the time information provided by the base station to compensate the frequency offset caused by the change in the environmental factors. As the electronic system 200 enters the low power consumption mode, the electronic system 200 stops receiving the time information provided by the base station, and the control module 22 however continues to control the capacitor array 23 according to the previously recorded frequency offset information to compensate the frequency offset caused by the change in the environmental factors. On the other hand, assume that when the electronic system 200 is in the normal operation mode, the load contributed by the buffer amplifier 25A, the frequency divider 25B and the capacitor array 23, and is seen by the oscillation signal source 21 is a predetermined amount (a first loading amount). Thus, the control module 22 adopts a predetermined counter threshold of the frame counter 24; that is, the frequency offset caused by the change in the loading amount need not be compensated. When the electronic system 200 is in the low power consumption mode, the load contributed by the frequency divider 25B and the capacitor array 23, and is seen by the oscillation signal source 21 is different from the first loading amount, and is to be referred to as a second loading amount. However, the foregoing assumptions are not to be construed as limitations of the scope of the invention.

In one embodiment, when the electronic system 200 is switched from the normal operation mode to the low power consumption mode, the control module 22 continues utilizing a setting of the capacitor array 23 before the capacitor array 23 enters the low power consumption mode (i.e., the frequency offset compensation amount that the capacitor array 23 provides in the normal operation mode), and however changes the counter threshold that the frame counter 24 adopts. One person skilled in the art of the technical field can appreciate that, for a subsequent circuit, changing the counter threshold of the frame counter 24 is equivalent to changing an output signal frequency of the frequency divider 25B, i.e., providing a frequency offset compensation amount. As previously described, the frequency offset caused by the change in the loading amount due to turning off the buffer amplifier 25A and/or part of the capacitor array 23 may be measured in advance before the electronic system 200 is shipped out of the factory. A circuit designer may accordingly estimate the amount of change to be made in the counter threshold of the frame counter 24 in order to compensate the frequency offset caused by the change in the loading amount. In practice, the counter thresholds corresponding to different modes may be stored in the control module 22 in advance. When the electronic system 200 returns to the normal operation mode, the control module 22 restores the counter threshold of the frame counter 24 to a predetermined value (i.e., terminating the frequency compensation function provided by the frame counter 24), and selectively tunes the capacitor array 23 again according to the time information provided by the base station.

In another embodiment, in the normal operation mode, the control module 22 further records frequency offset information associated with the environmental factors, e.g., the amount of frequency offset caused by the environmental factors, or a control code of the fine-tune capacitor array 23B before entering the low power consumption mode. When the electronic system 200 is switched from the normal operation mode to the low power consumption mode, the setting before the capacitor array 23 enters the low power consumption mode as in the previous embodiment is not utilized. In this embodiment, after the electronic system 200 enters the low power consumption mode, the control module 22 reduces capacitance values of the coarse-tune capacitor array 23A and the fine-tune capacitor array 23B (e.g., setting both of the coarse-tune capacitor array 23A and the fine-tune capacitor array 23B to have a minimum capacitance value, such as zero). Since the capacitor array 23 also affects the loading amount of the oscillation signal source 21 and causes frequency offset on the oscillation signal source 21 when its setting is changed, the capacitor array 23 can be regarded as a part of the loading module 25. In practice, as the change in the loading amount caused by setting the capacitor array 23 to have a reduced capacitance value also causes a frequency offset, the control module 22 correspondingly controls the frame counter 24 to further compensate the frequency offset of the oscillation signal source 21 caused by the reduced capacitance value of the capacitor array 23. That is to say, in addition to compensating the frequency offset caused by the environmental factors and turning off the buffer amplifier 25A, the frame counter 24 also compensates the frequency offset caused by reducing the capacitance value of the capacitor array 23. As previously described, the frequency offset caused by the environmental factors is recorded by the control module 22 or learned from the control code of the fine-tune capacitor array 23B, the control module 22 may accordingly estimate how to further adjust the counter threshold of the frame counter 24. More specifically, according to the control code of the capacitor array 23 in the normal operation mode (i.e., before the reduction) and the control code of the capacitor array 23 in the low power consumption mode (i.e., after the reduction), the control module 22 may learn a difference between before and after the reduction. According to a corresponding relationship between the control code of the capacitor array 23 and the frequency offset compensation amount, the control module 22 obtains a frequency offset compensation amount to accordingly adjust the counter threshold of the frame counter 24. In practice, the corresponding relationship between the control code of the capacitor array 23 and the frequency offset compensation amount can be measured or calculated in advance and be recorded in the control module 23 or the electronic system 200. An advantage of the above approach is that, by reducing the capacitance values of the coarse-tune capacitor array 23A and the fine-tune capacitor array 23B, the loading amount of the oscillation signal source 21 is lowered, accompanied by a lowered power consumption. In other words, the above approach helps the electronic system 200 to further lower the power consumption in the low power consumption mode, thereby prolonging the standby time of the electronic system 200.

In another embodiment, when the electronic system 200 is switched from the normal operation mode to the low power consumption mode, the control module 22 compensates the frequency offset caused by the change in the loading amount due to turning off the buffer amplifier 25A or part of the tuning capacitor array 23 (e.g., both of the coarse-tune capacitor array 23A and the fine-tune capacitor array 23B are set to have a minimum capacitance value) by changing the counter threshold of the frame counter 24. There is still a residual frequency error due to the finite resolution of the frame counter. However, given the low power consumption period of the electronic system 200 is not long in typical systems, the time deviation may be corrected according to the time difference between the start of the local system event (e.g. entering the normal operation mode) and the time instance when the base station starts transmitting a paging signal to the system 200. For example, the electronic system 200 needs to be switched from the low power consumption mode to the normal operation mode at time t, but the electronic system 200 is switched to the normal operation mode at time t-x due to the time error. A counter may be used to count the time difference between the time instance that the electronic system 200 is switched to the normal operation mode and the time instance that the electronic system 200 receives the paging signal from the base station. When the electronic system 200 receives the paging signal from the base station at time t, the electronic system 200 can extract the time difference x based on the counter. Such approach also helps the electronic system 200 to lower the power consumption in the low power consumption mode.

In another embodiment, when the electronic system 200 is switch from the normal operation mode to the low power consumption mode for the first time, the control module 22 compensates the frequency offset caused by the change in the loading amount due to turning off the buffer amplifier 25A or part of the capacitor array 23 to lower the power consumption by changing the counter threshold of the frame counter 24. As previously described, as the electronic system 200 again enters the normal operation mode, the control module 22 corrects the time error that occurred in a previous low power consumption period according to the time difference between the time instance that the electronic system 200 is switched to the normal operation mode and the time instance that the electronic system 200 receives the paging signal from the base station. In this embodiment, the control module 22 further calculates the frequency offset caused by the reduced capacitance value of the capacitor array 23 according to the size of the time error, and utilizes the calculated frequency offset as a frequency offset correction amount. Later, when the electronic system 200 is again switched from the normal operation mode to the low power consumption mode, in addition to compensating the frequency offset caused by the change in the loading amount due to turning off the buffer amplifier 25A or part of the capacitor array 23, the control module 22 controls the frame counter 24 to also compensate the frequency offset estimated based on the time error according to the frequency offset correction amount.

In another embodiment, when the electronic system 200 is switched from the normal operation mode to the low power consumption mode for the first time, the control module 22 compensates the frequency offset caused by the change in the loading amount due to turning off the buffer amplifier 25A or part of the capacitor array 23 (e.g., setting both of the coarse-tune capacitor array 23A and the fine-tune capacitor array 23B to have a minimum capacitance value such as zero) by changing the counter threshold of the frame counter 24, That is to say, in addition to compensating the frequency offset caused by the change in the loading amount due to turning off the buffer amplifier 25A or part of the capacitor array 23, the frame counter 24 also compensates the frequency offset caused by the reduced capacitance value of the capacitor array 23. Since the frequency offset can be learned from the control value of the capacitor array 23, the control module 22 may further estimate how to further adjust the counter threshold of the frame counter 24. After the electronic system 200 again enters the normal operation mode, the control module 22 may correct the time error that occurred in a previous low power consumption period according to the time difference between the time instance that the electronic system 200 is switched to the normal operation mode and the time instance that the electronic system 200 receives the paging signal from the base station. In this embodiment, the control module 22 further obtains a frequency offset correction amount according to the time error. Later, when the electronic system 200 is again switched from the normal operation mode to the low power consumption mode, the control module 22 controls the frame counter 24 to further compensate the time error according to the frequency offset correction amount.

In another embodiment, when the electronic system 200 is switched from the normal operation mode to the low power consumption mode, the control module 22 compensates the frequency offset caused by the change in the loading amount due to turning off the buffer amplifier 25A or part of the capacitor array 23 by similarly changing the counter threshold of the frame counter 24, with however also changing the setting value of the capacitor array 23. In this embodiment, when the electronic system 200 is switched from the normal operation mode to the low power consumption mode, the control module 22 sets the coarse-tune capacitor array 23A to have a minimum capacitance value, and controls only the fine-tune capacitor array 23B to compensate the frequency offset caused by the environmental factors. In practice, as the change in the loading amount caused by setting the coarse-tune capacitor 23A to have a minimum capacitance value also causes a frequency offset, such frequency offset is compensated by similarly changing the counter threshold of the frame counter 24. The loading amount that the coarse-tune capacitor array 23A in different setting values forms on the oscillation signal source 21 is known, and the frequency offset caused by the change in the loading amount can also be measured or calculated in advance before the electronic system 200 is shipped out of the factory. The frequency offset information may be recorded in the control module 22, or be recorded in a storage device accessible by the control module 22 in the electronic system 200. The control module 22 may control the frame counter 24 according to the frequency offset information to perform compensation. In practice, when the coarse-tune capacitor array 23A is set to have a minimum capacitance value, due to a change in the overall loading structure, the corresponding relationship between the setting value of the fine-tune capacitor array 23B and the frequency offset compensation amount is also changed, as shown by an example in FIG. 4(A).

Figure 4A:
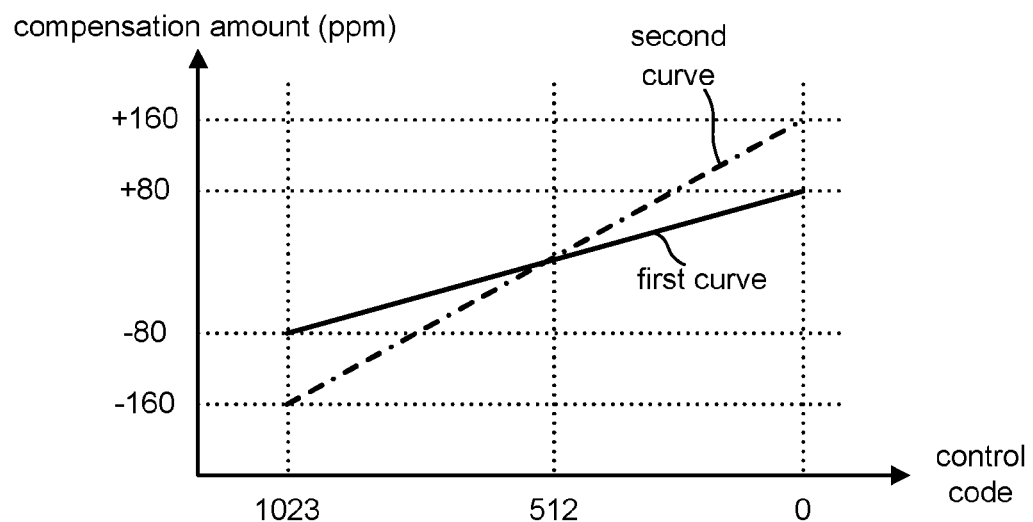
FIG. 4(A) and FIG. 4(B) illustrate corresponding relationships between a capacitor control code and a frequency offset compensation amount under different modes.

In FIG. 4(A), the horizontal-axis coordinate represents the control code corresponding to the capacitance value of capacitance array 23B; the capacitance value gets larger as the control code gets larger. In FIG. 4(A), the vertical-axis coordinate represents the frequency offset compensation amount. In this example, the fine-tune capacitor array 23B is designed to provide a frequency offset compensation value of −80 ppm~+80 ppm (the first curve) under the normal operation mode. As shown in FIG. 4(A), when the coarse-tune capacitor array 23A is set to have the minimum capacitance value, the frequency offset compensation amount that the fine-tune capacitor array 23B can provide becomes −160 ppm~+160 ppm (the second curve). Therefore, in the low power consumption mode, the control module 22 needs to change the control code of the fine-tune capacitor array 23B according to the new corresponding relationship. For example, to provide the same frequency offset compensation amount of +40 ppm, the control code of the fine-tune capacitor array 23B in the normal operation mode is 256 and may change to 384 in the low power consumption mode. To have the fine-tune capacitor array 23B provide a frequency offset compensation amount of −80ppm~+80 ppm in the low power consumption mode, the fine-tune capacitor array 23 having a control code between 256 and 768 is sufficient. It should be noted that, the corresponding relationship between the control code of the fine-tune capacitor array 23 and the frequency offset compensation amount can be measured or calculated in advance. Taking FIG. 4(A) for example, before the electronic system 200 is shipped out of the factory, on the basis that the control code of the fine-tune capacitor array 23B is 512, a slope of the first curve (the normal operation mode) and a slope of the second curve (the low power consumption mode) are measured, and the slopes and the control code of the fine-tune capacitor array 23B serving as references are recorded. It should be noted that, the measurement and calculation for the corresponding relationship are known to one person skilled in the art, and shall be omitted herein.

Figure 4B:
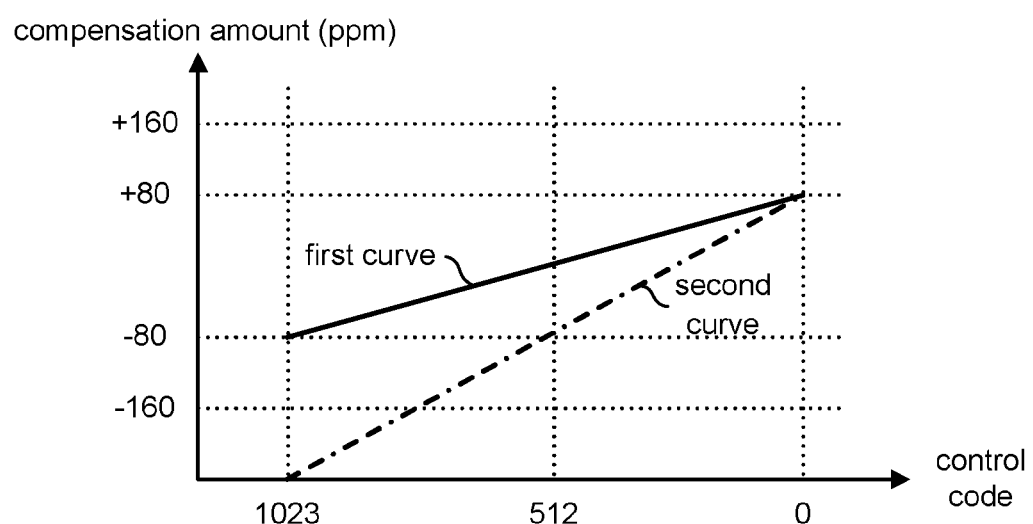

In another embodiment, as shown in FIG. 4(B), when the control code is 0, the fine-tune capacitor array 23B provides a frequency offset compensation amount of +80 ppm. In this example, to have the fine-tune capacitor array 23B provide a frequency offset compensation amount of −80 ppm~+80 ppm in the low power consumption mode, the fine-tune capacitor array 23B having a control code between 0 to 512 is sufficient to thus further lower the power consumption of the electronic system 200. In practice, before the electronic system 200 is shipped out of the factory, on the basis that the control code of the fine-tune capacitor array 23B is 0, the slope of the first curve (the normal operation mode) and the slope of the second curve (the low power consumption mode) are measured, and the slopes and the control code of the fine-tune capacitor array 23B serving as references are recorded. As such, the corresponding relationship between the control code of the fine-tune capacitor array 23B and the frequency offset compensation amount shown in FIG. 4(B) can be obtained.

Figure 5:
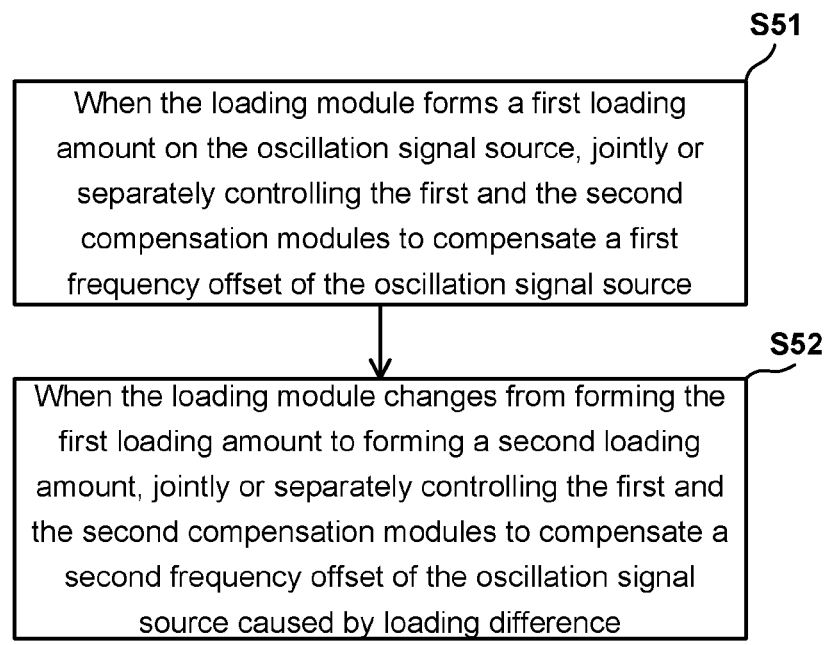
FIG. 5 is a flowchart of a frequency offset compensating method according to an embodiment of the present invention.

According to another embodiment of the present invention, a frequency offset compensating method applied to an electronic system is provided. FIG. 5 shows a flowchart of the frequency offset compensating method. The electronic system includes an oscillation signal source, a loading module, a first compensation module, and a second compensation module. In step S51, when the loading module forms a first loading amount on the oscillation signal source, the first and second compensation modules are jointly or separately controlled to compensate a first frequency offset of the oscillation signal source caused by at least one environmental factor with a first setting. In step S52, when the loading module changes from forming the first loading amount to forming a second loading amount on the oscillation signal source, the first and second compensation modules are jointly or separately controlled to compensate a second frequency offset of the oscillation signal source caused by a loading difference with a second setting. The loading difference is a difference between the first loading amount and the second loading amount. One person skilled in the art can understand that, various operations and modifications in the description associated with the electronic system 200 are applicable to the frequency offset compensating method in FIG. 5, and shall be omitted herein.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A control method, applied to a communication device comprising an oscillation signal source, a tunable capacitor array and a frame counter, the control method comprising:
when the communication device operates in a normal mode, compensating a first frequency offset of the oscillation signal source jointly or separately by the tunable capacitor array and the frame counter; and
when the communication device operates in a low power consumption mode, compensating a second frequency offset of the oscillation signal source jointly or separately by the tunable capacitor array and the frame counter.

2. The control method according to claim 1, further comprising:
providing predetermined compensation information;
wherein, the frame counter compensates the second frequency offset of the oscillation signal source according to the predetermined compensation information.

3. The control method according to claim 1, further comprising:
when the communication device is switched from the normal mode to the low power consumption mode, reducing a capacitance value of the tunable capacitor array.

4. The control method according to claim 3, wherein when the communication device operates in the low power consumption mode, the frame counter compensates the second frequency offset of the oscillation signal source according to a control value of the tunable capacitor array.

5. The control method according to claim 1, further comprising:
determining correction information according to a time difference between the time instance that the communication device is switched to the normal mode and the time instance that the communication device receives a paging signal from a base station;
wherein, when the communication device operates in the low power consumption mode, the frame counter compensates the second frequency offset of the oscillation signal source according to the correction information.

6. The control method according to claim 1, wherein the first frequency offset is caused by at least one environmental factor, which comprises a temperature factor or a power supply factor.

7. The control method according to claim 6, wherein the tunable capacitor array comprises a coarse-tune capacitor array and a fine-tune capacitor array; the control method further comprising:
when the communication device operates in the low power consumption mode, compensating the first frequency offset of the oscillation signal source by the frame counter according to a setting value of the fine-tune capacitor array before entering the second mode.

8. The control method according to claim 6, wherein the tunable capacitor array comprises a coarse-tune capacitor array and a fine-tune capacitor array; the control method further comprising:
reducing a capacitance value of the coarse-tune capacitor array and correspondingly changing a setting value of the fine-tune capacitor array to compensate the first frequency offset.

9. The control method according to claim 8, wherein when the communication device operates in the low power consumption mode, the frame counter compensates the second frequency offset of the oscillation signal source according to a setting value of the coarse-tune capacitor array.

10. A communication device, comprising:
an oscillation signal source;
a tunable capacitor array;
a frame counter; and
a control module, configured to jointly or separately control the tunable capacitor array and the frame counter to compensate a first frequency offset of the oscillation signal source when the communication device operates in a normal mode, and to jointly or separately control the tunable capacitor array and the frame counter to compensate a second frequency offset of the oscillation signal source when the communication device operates in a low power consumption mode.

11. The communication device according to claim 10, wherein the control module controls the frame counter to compensate the second frequency offset of the oscillation signal source according to predetermined compensation information.

12. The communication device according to claim 10, wherein the control module reduces a capacitance value of the tunable capacitor array when the communication device is switched from the normal mode to the low power consumption mode.

13. The communication device according to claim 12, wherein when the communication device operates in the low power consumption mode, the frame counter compensates the second frequency offset of the oscillation signal source according to a control value of the tunable capacitor array.

14. The communication device according to claim 10, wherein the control module determines correction information according to a time difference between the time instance that the communication device is switched to the mode and the time instance that the communication device receives a paging signal from a base station, and controls the frame counter to compensate the second frequency offset of the oscillation signal source according to the correction information when the communication device operates in the low power consumption mode.

15. The communication device according to claim 10, wherein the first frequency offset is caused by at least one environmental factor, which comprises a temperature factor or a power supply factor.

16. The communication device according to claim 15, wherein the tunable capacitor array comprises a coarse-tune capacitor array and a fine-tune capacitor array, and when the communication device operates in the low power consumption mode, the frame counter compensates the first frequency offset of the oscillation signal source according to a setting value of the fine-tune capacitor array before entering the low power consumption mode.

17. The communication device according to claim 15, wherein the tunable capacitor array comprises a coarse-tune capacitor array and a fine-tune capacitor array, and the control module reduces a capacitance value of the coarse-tune capacitor array and correspondingly changes a setting value of the fine-tune capacitor array to compensate the first frequency offset.

18. The communication device according to claim 17, wherein when the communication device operates in the low power consumption mode, the frame counter compensates the second frequency offset of the oscillation signal source according to a setting value of the coarse-tune capacitor array.

* * * * *